United States Patent [19]

Scholl et al.

[11] 4,207,293
[45] Jun. 10, 1980

[54] CIRCUMFERENTIAL ERROR SIGNAL APPARATUS FOR CRYSTAL ROD PULLING

[75] Inventors: Richard A. Scholl, Palo Alto; John L. Cole, Fremont, both of Calif.

[73] Assignee: Varian Associates, Inc., Palo Alto, Calif.

[21] Appl. No.: 857,331

[22] Filed: Dec. 5, 1977

Related U.S. Application Data

[63] Continuation of Ser. No. 682,293, May 3, 1976, abandoned, which is a continuation of Ser. No. 479,316, Jun. 14, 1974, abandoned.

[51] Int. Cl.$^2$ .................. B01D 9/00; B01J 17/18; G01N 21/48
[52] U.S. Cl. .................. 422/249; 23/301; 156/601; 156/617 SP; 250/571; 250/572; 250/574; 356/385; 356/386
[58] Field of Search .................. 156/601, 617 SP; 23/301; 356/385, 386; 250/571, 572, 574; 422/249

[56] References Cited

U.S. PATENT DOCUMENTS

| | | | |
|---|---|---|---|
| 3,291,650 | 12/1966 | Dohmen | 156/601 |
| 3,621,213 | 11/1971 | Jen | 156/601 |
| 3,692,499 | 9/1972 | Andrychuk | 156/601 |
| 3,740,563 | 6/1973 | Reichard | 156/601 |
| 3,998,598 | 12/1976 | Bonora | 156/601 |

*Primary Examiner*—Joseph Scovronek
*Assistant Examiner*—Bradley Garris
*Attorney, Agent, or Firm*—Stanley Z. Cole; Edward H. Berkowitz

[57] ABSTRACT

The circumference of a crystal rod is monitored and controlled during the rod growing process by providing relative rotation between the growing crystal rod and a melt of the crystal material as the rod is being pulled from the melt according to the Czochralski method, and by using a radiation-sensitive control system for adjusting growth conditions of the rod in response to variations in a radiation signal which is indicative of the circumferential dimension of the rod. An electronic circuit integrates the radiation signal over each complete rotation of the rod, thereby eliminating unnecessary adjustment of the growth conditions in response to diametric variations of the rod which recur regularly in each rotation.

14 Claims, 9 Drawing Figures

CIRCUMFERENTIAL ERROR SIGNAL APPARATUS FOR CRYSTAL ROD PULLING

This is a continuation of application Ser. No. 682,293, filed May 3, 1976, now abandoned, and which is a continuation of application Ser. No. 479,316, filed June 14, 1974, now abandoned.

BACKGROUND OF THE INVENTION

1. Field of the Invention

This invention is a further development in the art of crystal growing by the Czochralski method, and in particular relates to the monitoring and control of the cross-sectional dimensions of a crystal rod.

2. Description of the Prior Art

The Czochralski method of crystal pulling is widely used to provide crystal rods for the semiconductor industry. In summary, the Czochralski method involves melting high-purity semiconductor material in a crucible in a nonreactive atmosphere, and maintaining the temperature of the melt at just above the freezing point. A seed crystal is dipped at a particular orientation into the melt, and is thereafter slowly raised from the melt so that liquid from the melt will adhere to the withdrawing seed crystal. As the seed crystal with its adhering material is pulled away from the melt, an elongate crystal rod can be formed. The diameter of the crystal rod so formed is a function of a number of variables. For example, the temperature of the melt in the vicinity of the liquid-solid phase boundary, i.e., adjacent the interface between the melt and the growing rod, has a major effect on the rod diameter. Changes in the melt temperature can result in significant variations in the rod diameter. Such variations in the rod diameter can result in serious and costly waste, because the rod must thereafter be trimmed and cut to produce wafer slices of uniform physical dimensions.

It is believed that the temperature of the melt is dependent upon the time rate of withdrawal of liquid from the melt. Consequently, it is important to be able to control the time rate of upward motion of the rod from the melt in response to changes in the diameter of the growing crystal rod. A number of techniques have been devised to sense changes in the magnitude of the rod diameter, and to generate signals responsive to such diametric changes. Such signals indicative of changes in the rod diameter serve to actuate means for adjusting growth conditions such as the pulling rate of the growing rod in order to compensate for any irregularities in the diameter of the rod. In general, an increase in the pulling rate will tend to decrease the rod diameter while a decrease in the pulling rate will tend to increase the rod diameter. The relationships between other parameters and the rod diameter have been determined for particular crystal pulling systems on a mainly empirical basis.

U.S. Pat. No. 3,259,467 discloses a technique for controlling the diameter of a rod being pulled from a melt by continuously monitoring the weight-to-length quotient of the rod, and by regulating a growth condition such as the pulling speed in dependence upon the weight-to-length quotient. U.S. Pat. No. 3,291,650 discloses a technique for utilizing the optically reflective property of the meniscus formed at the interface between the melt and the crystal rod being drawn therefrom to provide a signal indicative of changes in the diameter of the rod. U.S. Pat. No. 3,493,770 shows the use of a photovoltaic optical pyrometer to sense variations in the radiation emitted by the surface of the melt near the rod/melt interface as the rod diameter changes, and means for adjusting various growth conditions of the rod in response to such variations in the emitted radiation so sensed. U.S. Pat. No. 3,692,499 shows means for simultaneously monitoring the radiation intensity at a plurality of points along each of three different radius lines of the meniscus which forms at the rod/melt interface, and means for controlling growth conditions such as pulling speed in response to variations in the monitored radiation intensity.

According to techniques known to the prior art, changes in the diameter of a crystal rod being grown by the Czochralski method have been detected by optical means, and signals responsive to such diametric changes have been used to adjust the growth conditions of the rod so as to counteract the tendency of the rod diameter to change. However, with the techniques known to the prior art, many unnecessary adjustments of the crystal rod growth conditions are oftentimes made. For example, as the seed crystal draws material from the melt, the material so drawn adheres to the seed crystal in a configuration which is determined by the crystalline structure of the seed crystal. Additional material from the melt adheres to material previously drawn from the melt according to a pattern determined initially by the crystalline structure of the seed crystal and the orientation of the seed crystal with respect to the surface of the melt. The resulting elongate crystal rod which is formed as the seed crystal is withdrawn from the melt will in general not have a uniformly circular cross section. The diameter of the rod will therefore vary on any given transverse cross section through the rod, because of so-called flat spots on the growing crystal. In a crystal pulling apparatus which provides for relative rotation of the growing crystal rod and the liquid melt, such variations in the rod diameter will be detected. Unless such variations which recur with regularity with each rotation of the rod are filtered out, unnecessary adjustment signals will be generated to activate means for varying particular crystal growth conditions. In the usual case, the frequency of rotation of the growing crystal rod is not much faster than the natural frequencies of the crystal growth mechanism. Consequently, filters used to suppress the generation of such unnecessary adjustment signals are likely to cause severe attenuation of the diameter indicating signal itself or to cause unwanted phase shifts in the automatic control system for activating the means for varying the growth conditions. Such unwanted phase shifts could render control of the growth conditions extremely sluggish or unstable.

SUMMARY OF THE INVENTION

The present invention provides a means for monitoring and controlling the cross-sectional configuration of a crystal rod grown according to the Czochralski method in an apparatus which provides for relative rotation between the rod being grown and the melt. According to the present invention, the circumference of the crystal rod is monitored rather than the diameter. An electronic circuit is provided which integrates the output of an optical detector over one complete rotation of the growing crystal rod and which then produces a signal which is a measure of the circumference of the rod. Such a circumferential signal does not vary with regularly occurring diametric variations such as might be caused by flat spots on the crystal, and therefore eliminates unnecessary adjustments and compensating readjustments of the growth conditions due to such regularly occurring variations.

BRIEF DESCRIPTION OF THE DRAWING

FIG. 5, A-D, shows waveforms of the electrical signals obtained from the electronic circuits shown in FIGS. 3 and 4.

DETAILED DESCRIPTION OF THE INVENTION

Figure 1:
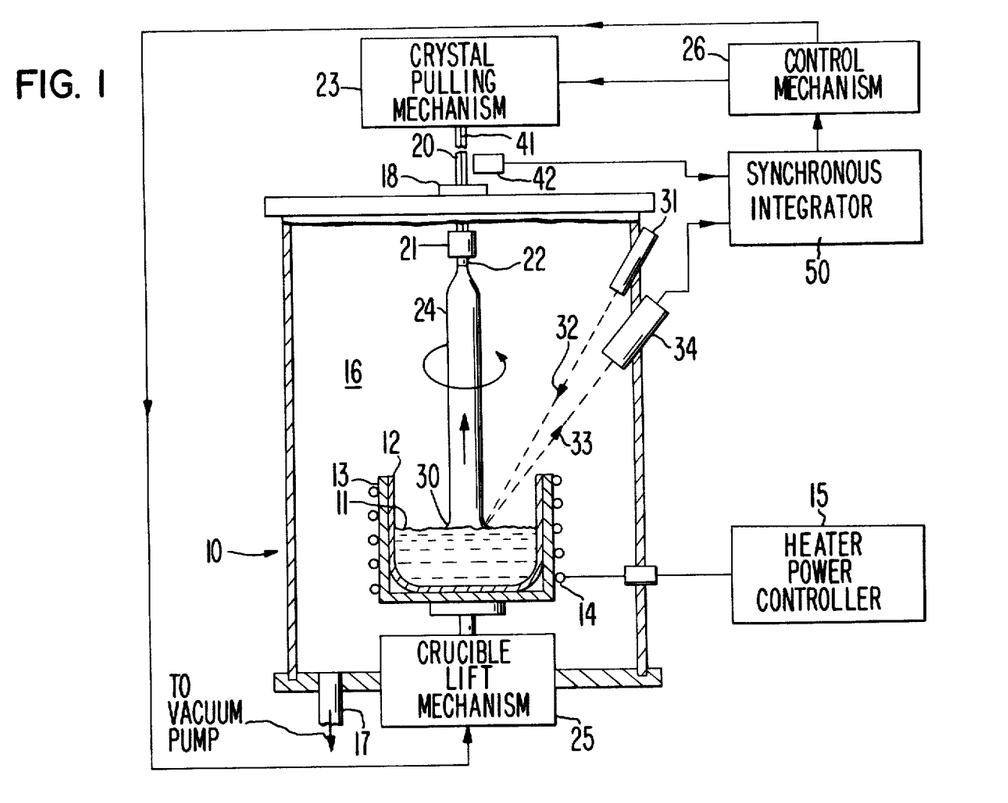
FIG. 1 shows a longitudinal cross-sectional view, partly in schematic form, of a crystal growing apparatus according to the present invention.

FIG. 1 shows a crystal growing apparatus of the Czochralski type, which comprises an evacuable chamber 10. A quantity of high-purity molten semi-conductor material 11 such as silicon or germanium is contained within a quartz crucible 12, which is surrounded by a graphite susceptor 13 within the chamber 10. The semiconductor material 11 is maintained in a molten state by heat which is provided by heater element 14 controlled by a heater power controller 15. The heater element 14 may comprise radio-frequency induction coils, in which case the heater power controller 15 would be a radio-frequency generator. It is frequently desirable to remove oxygen from the region 16 above the surface of the melt 11 in order to prevent the formation of oxides which can readily be formed at melt temperatures. Consequently, the region 16 above the melt surface can be evacuated by conventional pumping means through a port 17. In certain applications, it may be desirable to back-fill the evacuated region 16 within an inert gas such as argon. Such back-filling can be accomplished by conventional fittings and means which are not shown in the drawing. A chuck 21 rigidly holds a seed crystal 22 at the end of a vertical shaft 20 in a particular orientation with respect to the surface of the molten semiconductor material 11. The seed crystal 22 is a pure crystal of the same material as is contained within the crucible 12. The shaft 20 extends through the top wall of the chamber 10 by means of a suitable feed-through fitting 18 to a crystal pulling mechanism 23. The crystal pulling mechanism 23 provides means for vertically translating the seed crystal 22 up and down perpendicular to the surface of the molten semiconductor material 11, and means for rotating the seed crystal about that vertical translational path as an axis. The seed crystal 22 is allowed to dip into the molten semiconductor material 11, and is thereupon slowly withdrawn upwardly from the molten material 11 at a rate typically in the range from 2.5 to 15 centimeters per hour. As the seed crystal 22 is withdrawn vertically from the molten material 11, it is also rotated about its vertical axis at a rate typically in the range from 30 to 120 degrees per second.

As the seed crystal 22 withdraws from the molten material 11, heat is also thereby withdrawn from the mass of the molten material 11 in the region of exit of the seed crystal 22. This withdrawal of heat energy causes crystallization of a quantity of the molten material in the crucible 12 adjacent the seed crystal 22. This newly crystallized material adheres to the seed crystal 22 because of the interatomic attractive forces which serve to form the crystal lattice. In this way, a crystal rod 24 can be said to be "grown" or "pulled" from the molten semiconductor material 11 in the crucible 12.

The cross-sectional diameter of the crystal rod 24 which is formed by withdrawing the seed crystal 22 from the molten semiconductor material 11 is a function of a number of variables, including the rate of vertical translation of the rod 24. Consequently, changes in the pulling rate can cause variations in the diameter of the growing rod 24, and the ability to control the pulling rate can be used to compensate for the effects of other variables upon the diameter of the crystal rod 24. For example, by decreasing the rate at which the rod 24 is pulled away from the molten material 11, the rod diameter can generally be increased; and conversely, by increasing the rate at which the rod 24 is pulled away from the molten material 11, the rod diameter can generally be decreased.

Since the temperature and the temperature profile at the surface of the molten material 11 are dependent upon the position of that surface relative to the heater element 14, and since these parameters in turn affect the diameter of the crystal rod 24, the embodiment shown in FIG. 1 is provided with a crucible lift mechanism 25 for keeping the surface of the molten semiconductor material 11 at a constant position relative to the heater element 14 while material is being withdrawn from the molten mass as the crystal rod 24 is being pulled upward from the surface of the molten mass. As shown in FIG. 1, the crucible lift mechanism 25 is controlled by a control mechanism 26 which will be described in more detail hereinafter.

It is economically important to be able to maintain a uniform cross-sectional diameter for the crystal rod 24 through out its length. In typical applications for the semiconductor industry, the rod 24 would be trimmed and polished so as to allow identically dimensioned wafers to be sliced therefrom. Any significant variations in the diameter of the rod 24 as it is growing would increase the amount of semiconductor material that would have to be removed during the trimming and polishing operations in order to obtain a rod of uniform diameter. Semiconductor material is expensive, and consequently, it would be economically desirable to prevent waste wherever possible.

The ability to control the diameter of the growing crystal rod 24 to close tolerances is provided by control mechanism 26 which continuously adjusts and readjusts the crystal pulling mechanism 23 and the crucible lift mechanism 25 in response to variations in the diameter of the crystal rod 24 as the rod 24 is being pulled from the molten material 11 in the crucible 12. As an incipient variation in the diameter of rod 24 is sensed, a signal indicative of the incipient variation is generated which actuates control mechanism 26, which in turn activates one or more of the crystal growth mechanisms such as the crystal pulling mechanism 23 in order to counteract the incipient variation in the rod diameter and thereby maintain a uniform diameter for rod 24.

At the interface between the crystal rod 24 and the molten material 11, a meniscus 30 is formed. The meniscus 30 is generally concave with respect to the environment above the surface of the molten material 11, which environment typically comprises an inert gas such as argon at atmospheric pressure, or a vacuum in the range from 1 to 100 torr. The meniscus 30 circumferentially surrounds the crystal rod 24 at the rod/melt interface, and the circumferential length of the meniscus 30 is a measure of the circumference of the rod 24 at this interface. It is noted that the meniscus 30 is not a static entity, but rather is an entity in flux with material leaving it to become part of the crystal rod 24 and with new material entering the meniscus 30 from the melt 11 as the rod 24 is rotated and withdrawn from the melt 11.

In the embodiment shown in FIG. 1, a radiation source 31, most suitably of visible light, is conveniently mounted to project a narrow beam 32 of radiation onto the meniscus 30. The meniscus 30, acting as a concave mirror, causes at least a portion of the incident radiation to be reflected as a beam 33 back to a detector 34. It is important that the meniscus 30 remain at a fixed level within the crucible 12 relative to the radiation source 31 and the detector 34, so that the meniscus 30 will constantly be in position to receive the radiation emanating from the source 31 and to reflect it back to the detector 34. In the embodiment shown in FIG. 1, the melt 11 and therefore the meniscus 30 can be maintained at the proper level by means of the crucible lift mechanism 25. In embodiments wherein means other than a crucible lift mechanism may be used to achieve a desired temperature and temperature profile at the surface of the melt 11, the radiation source 31 and the detector 34 can be made to track changes in the level of the meniscus 30 by a suitable servomechanism so as to enable the meniscus to receive radiation from the source 31 and to reflect it back to the detector 34.

Figure 2:
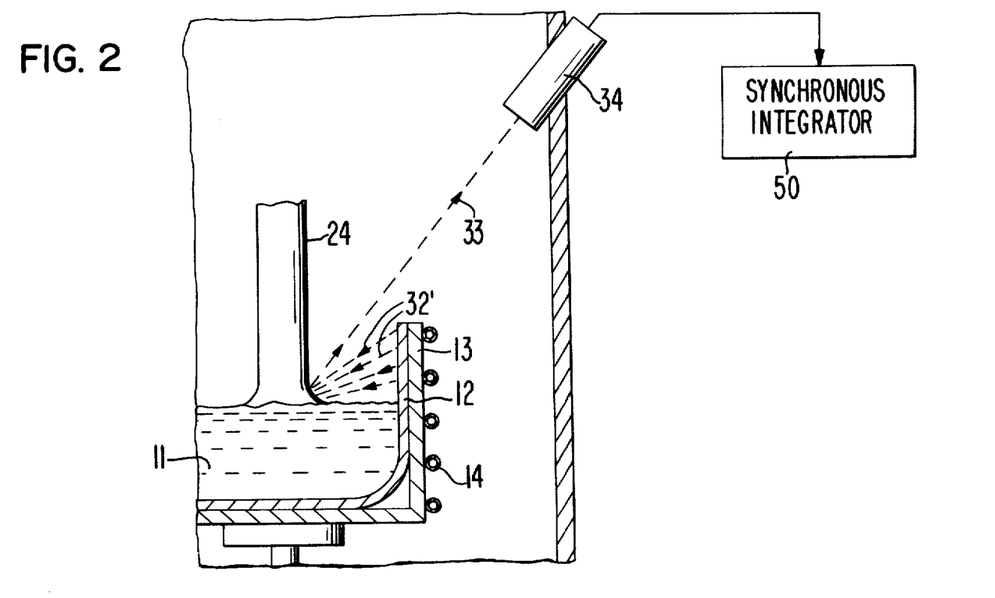
FIG. 2 shows an alternative to the embodiment shown in FIG. 1.

In a variation on the embodiment shown in FIG. 1, the independent radiation source 31 is not used and the detector 34 is an optical pyrometer which detects radiation, which may be in the infra-red as well as in the visible region of the electromagnetic spectrum, that is emitted by the walls of the crucible 12, as indicated at 32', and reflected by the meniscus 30 of the growing crystal as shown in FIG. 2. An advantage of using an independent radiation source 31, as shown in FIG. 1, is that the intensity of radiation reflected by the meniscus is thereby independent of variations in the temperature of the molten material 11. However, in applications where it would be advantageous to eliminate the independent radiation source 31, the principles of this invention are still applicable.

As the crystal rod 24 rotates, the meniscus 30 may not present an unvarying reflective surface configuration at the point of impingement of the beam 32 on the meniscus 30. Whenever the diameter of the rod 24 changes, the meniscus 30 will move with respect to the beam 32; and consequently, the beam 32 will impinge at different points on the concave surface of the meniscus 30 depending upon the diameter of the rod 24. Changes in the angle of reflection of the beam 33 can be used to indicate changes in the diameter of rod 24, and this technique is well-known to the prior art. However, in the case of a Czochralski crystal growing apparatus wherein a means is provided for rotating the crystal rod as it is being grown, there will frequently be cyclic variations sensed in the diameter of the crystal rod as the rod undergoes successive rotations. These cyclic variations can be caused by flat spots on the surface of the rod which result from the inherent structure of the crystal being grown; and/or they can result from variations in the precessional orbit of the shaft due to idiosyncratic mechanical characteristics of the particular apparatus being used. Such cyclic variations in the crystal rod diameter, whatever their cause, are not indicative of changes in the overall uniformity of the rod. Thus, it is desirable that the mechanisms which can be actuated in response to sensed incipient variations in the diameter of the rod not be actuatable by such recurring cyclic variations. In the embodiment shown in FIG. 1, it is desirable that the control mechanism 26 not be actuable in response to such cyclic variations.

The detector 34 is conveniently mounted to sense the reflected beam 33 for all reflection angles of interest. The detector 34 may be any suitable opto-electrical sensor device such as a suitably arranged photo-electric cell, or battery of such cells, which device generates an output electrical signal indicative of the position of the meniscus 30 at any given instant in time.

Affixed to the vertical shaft 20 is a thin stripe 41 running vertically the length of the shaft 20, which cooperates with a turn indicator 42 to provide an output electrical signal indicative of each complete rotation of the crystal rod 24. In a preferred embodiment, the turn indicator 42 comprises a source of light which is positioned to shine light onto the rotating shaft 20 and a photoelectric cell which is positioned to detect light reflected back from the rotating shaft 20. The shaft 20 is made of polished metal to provide the specular reflection necessary to enable the photoelectric cell to receive a substantially uniformly intense reflection from all portions thereof. The stripe 41 consists of a non-reflecting or poorly reflecting material bonded to a thin vertical portion of the shaft 20. In a particular embodiment, the stripe 41 comprises black paint. As the shaft 20 rotates, the photoelectric cell senses an interruption in the substantially uniform specular reflection of light once per rotation as the stripe 41 crosses the path of the light which is incident upon the rotating shaft 20. Each such interruption is indicative of a complete rotation of the crystal rod 24. The output signal from the detector 34 and the output signal from the turn indicator 42 are both fed as inputs to a synchronous integrator 50. It is a function of the synchronous integrator 50 to integrate the output signal from the detector 34 over one complete rotation of the crystal rod 24, thereby generating a signal indicative of the circumference of the rod 24 at the interface between the rod 24 and the molten material 11. In this way, the circumference of the rod 24 can be continuously measured as new increments to the length of the rod are being formed. It is a further function of the synchronous integrator 50 to retain in a memory device the circumference signal for any one complete rotation of the rod, until a new updated circumference signal for the next succeeding complete rotation is generated. The output of the synchronous integrator 50 is an electrical signal proportional to the retained circumference signal. It is this output control signal which actuates the control mechanism 26. The control mechanism 26 thereupon actuates the growth control mechanisms such as the crystal pulling mechanism 23 and the crucible lift mechanism 25 in order to vary the parameters which affect the diameter of the growing crystal rod 24. The control mechanism 26 compares the output control signal from the synchronous integrator 50 with a signal preset to the desired circumference level, and actuates the growth control mechanisms until the output control signal from synchronous integrator 50 is equal to the preset level. In this way, any incipient change in rod diameter detected by the synchronous integrator 50 is counteracted by the action of the control mechanism 26 to reduce the incipient change in rod diameter.

The synchronous integrator 50 may comprise any electronic circuit which effectively integrates the output signal from the reflected radiation detector 34 for a complete rotation of the crystal rod 24, and which retains this integrated signal for comparison with the desired preset level.

Figure 3:
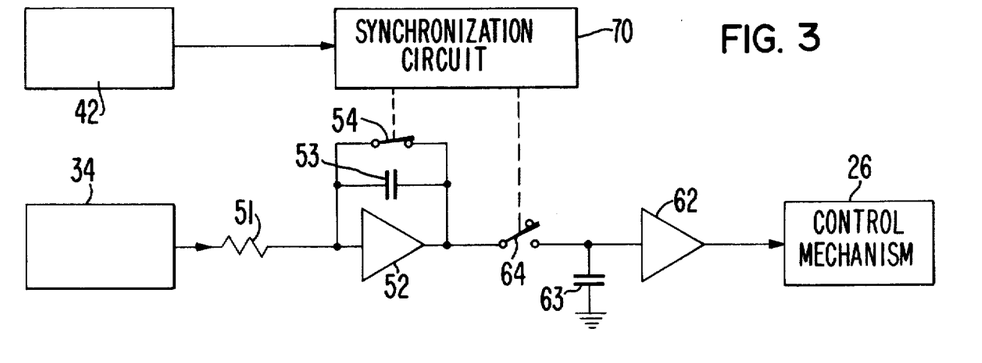
FIG. 3 shows in schematic form an electronic circuit for a circumferential signal integrator according to the present invention.

A simple embodiment of a suitable electronic circuit for the synchronous integrator 50 is shown in FIG. 3. The integrator circuit consists essentially of an operational amplifier comprising a resistor 51 in series with an integrated circuit amplifier 52 having a feedback capacitor 53 in parallel therewith, which can be shunted by switch 54. The memory circuit consists essentially of an amplifier 62 whose input is shunted to ground by a storage capacitor 63. The integrator circuit is electrically disconnectable from the memory circuit by means of switch 64. The amplifier 62 serves as a buffer to isolate the capacitor 63 from the control mechanism 26 so that the capacitor 63 will not discharge when switch 64 is open. Switches 54 and 64 are opened and closed by a suitable synchronization circuit 70 which responds to the output of the turn indicator 42. In operation, when the stripe 41 indicates to the turn indicator 42 that a new rotation of the rod 24 is beginning, an output signal from the turn indicator 42 causes the sychronization circuit 70 to generate two outputs in sequence. A first output from the synchronization circuit 70 then causes switch 64 to close for about 10 milliseconds and then to open again. A second output from the synchronization circuit 70, which occurs immediately after the completion of the first output (i.e., immediately after the reopening of switch 64), causes switch 54 to close for about 10 milliseconds and then to open again. This sequential closing and opening of switch 64, followed by the closing and opening of switch 54, is repeated for each rotation of the rod 24. FIG. 3 shows an instant during the rotation of the rod 24 at which the switch 64 has just reopened and the switch 54 has just closed. At this instant, because the switch 54 is closed, all charge that had previously accumulated on the capacitor 53 is allowed to be removed. Shortly thereafter, during the same rotation of the rod 24, the switch 54 is reopened. The reopening of switch 54 allows the capacitor 53 to become charged. The capacitor 53 may be viewed as an integrating capacitor, which integrates the output of the detector 34 over one complete rotation of the rod 24. After one full rotation of the rod 24 has been completed, the synchronization circuit 70 again causes the switch 64 to close briefly. The closure of switch 64 causes the capacitor 63 to become charged to the voltage on the capacitor 53 by the output of the amplifier 52. The output of the amplifier 52 is proportional to the integral of the output of the detector 34 over exactly one rotation of the crystal rod 24, namely, the previously completed rotation. Thus, the output of the amplifier 52 is a measure of the circumference of the rod 24 at the rod/melt interface. The switch 64 is allowed to remain closed only for a small fraction of the time required for the rod 24 to make a complete rotation, but long enough to allow the capacitor 63 to charge to the output level of the amplifier 52 as determined by the charge stored in the capacitor 53. Typically, switch 64 would remain closed on the order of 10 milliseconds. When switch 64 is opened again, switch 54 is thereupon closed briefly, thereby discharging capacitor 53 so that the integrator circuit can be ready for the next rotation of the rod 24. The switch 54 is also allowed to remain closed for only a small fraction of the time required for the rod 24 to make a complete revolution, but long enough to completely discharge the capacitor 53. Typically, the switch 54 would also remain closed on the order of 10 milliseconds. The output of the amplifier 52, however, remains stored in capacitor 63, thereby providing a continuous signal to the control mechanism 26 while charge is accumulating on the capacitor 53 during the next subsequent rotation of the rod 24. When switch 54 is opened again at the beginning of the next rotation period of the rod 24, a new integration begins for the signal arriving from the detector 34 during the next complete rotation of the crystal rod 24. For each successive rotation of the crystal rod 24, the aforedescribed opening and closing sequences for the switches 54 and 64 are repeated. Thus, the voltage on capacitor 63 is "updated" on each successive rotation of the crystal rod 24. Since the voltage impressed upon the capacitor 63 is proportional to the integral of the input signal from the radiation detector 34 over exactly one complete rotation of the rod 24, any variations in the signal from the detector 34 which repeat themselves cyclically during each rotation of the crystal rod 24 will not appear in the output signal from amplifier 62. Thus, the control mechanism 26 will not respond to cyclic variations in the diameter of the crystal rod 24 which repeat themselves during each rotation, but will respond only to variations in the rod diameter which are indicative of an incipient change in the overall uniformity of the rod along its length.

Figure 4:
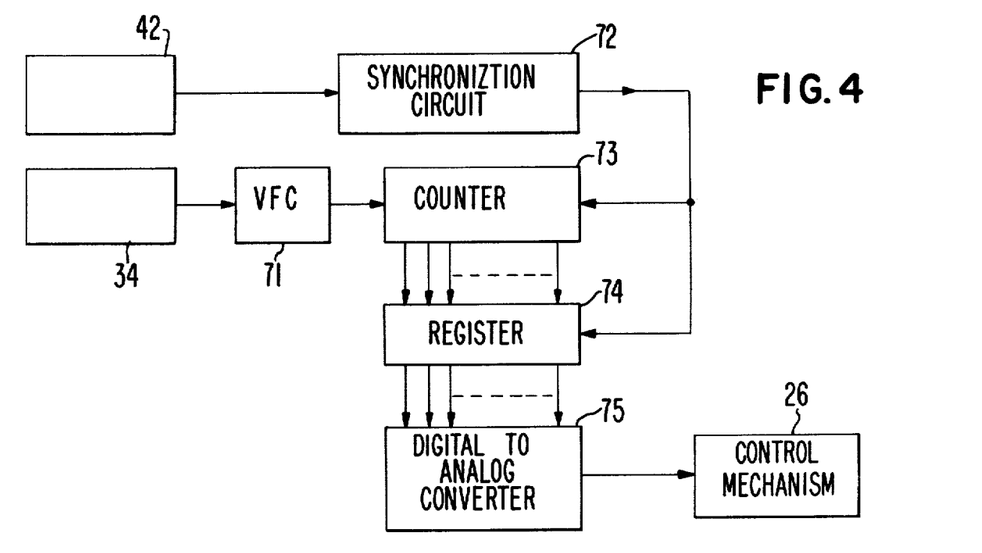
FIG. 4 shows in schematic form an alternative electronic circuit for the circumferential signal integrator of the present invention.
Figure 5A:
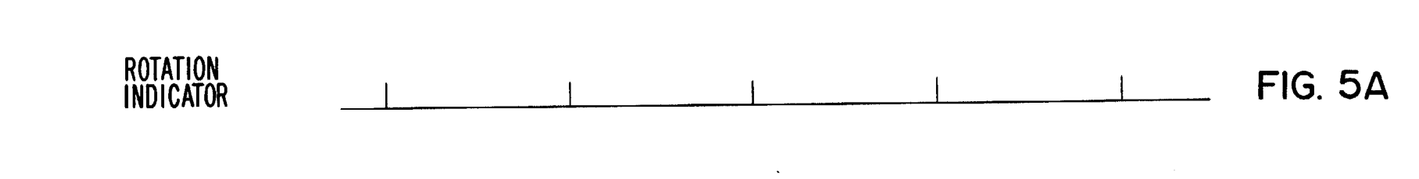
Figure 5B:
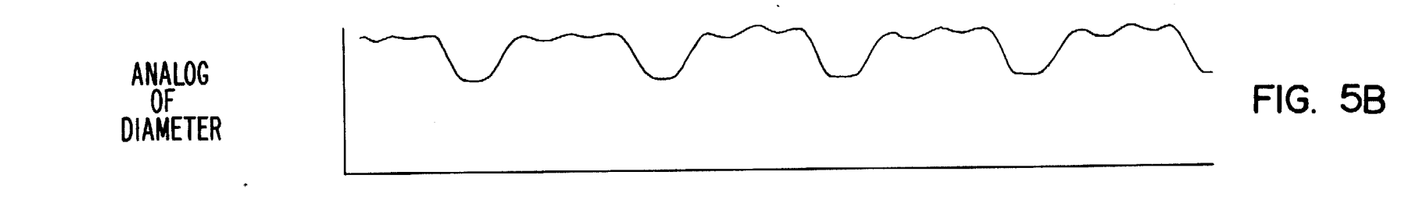
Figure 5C:
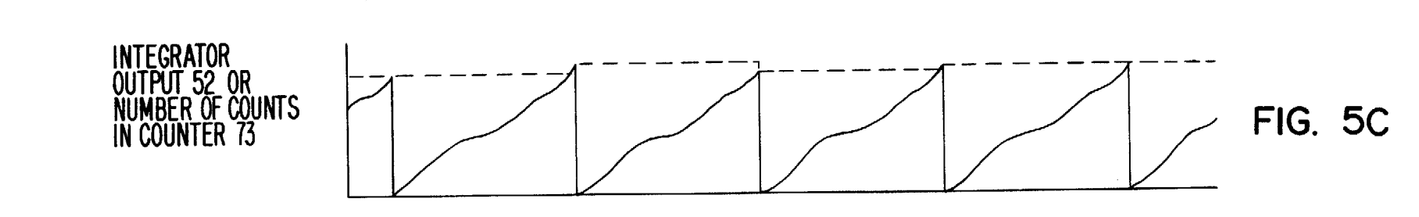
Figure 5D:
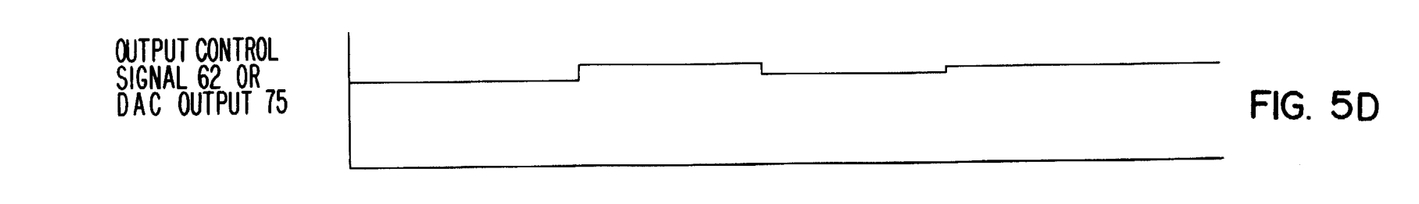

A preferred embodiment for the electronic circuit of the synchronous integrator 50 is shown in FIG. 4. Inasmuch as a typical rotation frequency for the rod 24 is 20 revolutions per minute or less, the memory circuit (e.g., the capacitor 63 in FIG. 2) must be capable of holding its charge without decay for three seconds or more. The circuit shown in FIG. 4 provides a more suitable means for obtaining a desirably long hold time for the memory circuit. In the circuit of FIG. 4, the output of the detector 34 is fed to a voltage-to-frequency converter 71, which produces a train of pulses whose frequency is precisely proportional to the input voltage from the detector 34. As the circumferential dimension of the rod 24 increases, the density of the pulses generated by the voltage-to-frequency converter 71 increases also. Thus, the number of pulses from the converter 71 in any given interval of time is proportional to the integral of the signal generated by the detector 34 over that interval of time. A counter 73 is provided to accumulate the pulses from the converter 71. After each complete rotation of the crystal rod 24, as indicated by a signal from synchronization circuit 72, the contents of the counter 73 are transferred to an array of memory devices represented by register 74. This transfer to memory is destructive, in that the counter 73 is reset to zero with each transfer of the contents thereof to the register 74. The register 74 serves to hold the result of each integration while the next subsequent integration is being performed. A digital-to-analog converter 75 converts the number held in the register 74 to an analog voltage signal which can be used as a control signal to actuate the control mechanism 26. By holding the result of each integration in the register 74 while the next subsequent integration is being performed, the digital-to-analog converter 75 thereby provides a continuous signal to the control mechanism 26 during the next subsequent rotation of the rod 24.

FIG. 5 indicates waveforms of the electrical signals obtained from the circuits of FIG. 3 and FIG. 4. These waveforms are not drawn to scale, but are somewhat exaggerated so that the variations in the signals may be clearly seen. For example, the actual variations in the final control signal, i.e., the variations in the output of the amplifier 62 in FIG. 3 or of the digital-to-analog converter 75 in FIG. 4, are much smaller than as illustrated in FIG. 5, being of the order of 1% or less of the signal amplitude. The rotation indicator 42 provides a periodic pulse once per rotation of the crystal rod 24, as indicated by waveform 5A. The detector 34 produces a signal, whose waveform 5B is related to the diameter of the crystal rod 24. Because of so-called "flats" on the crystal rod 24, the waveform 5B exhibits periodic variations with a period exactly equal to the rotation period of the rod 24. In the circuit shown in FIG. 3, the amplifier 52 in conjunction with the feedback capacitor 53 integrates the signal from the detector 34, thereby producing the signal shown in FIG. 5 as the solid line of waveform 5C. Similarly, in the circuit of FIG. 4, the counter 73 in conjunction with the voltage-to-frequency converter 71 integrates the signal from the detector 34, and the number of counts accumulated as a function of time is likewise represented by the solid line of waveform 5C. The rotation indicator 42 produces two effects: first, it transfers the result of the integration to a memory device, namely, the capacitor 63 in FIG. 3 or the register 74 in FIG. 4; and second, it resets the circuitry such that the integrated output falls to zero so as to prepare for the next rotation of the rod 24. This latter effect may be seen in the waveform 5C as the periodic return to zero of the integrated result, while the former effect is depicted in waveform 5D. For clarity, waveform 5D is also shown superimposed as a dotted line on waveform 5C.

Since both of the circuits shown in FIGS. 3 and 4 effectively integrate the output of the detector 34 with respect to time, and not with respect to the rotation angle of the crystal rod 24, the actual control signal level is dependent upon the rotation period of the crystal rod. Both the circuit of FIG. 3 and the circuit of FIG. 4 integrate the output of the detector 34 over $2\pi$ radians of rotation of the rod 24, regardless of the rotation period of the rod 24. However, with these circuits, if the rotation period of the rod changes, the resulting signal to the control mechanism 26 changes correspondingly. This apparent source of inconsistency is usually acceptable in practice, since the crystal rod generally rotates at a constant frequency. However, in applications where it would be desirable to integrate the output of the detector 34 with respect to angle, this can be accomplished by a modification of the integrating circuit. This modification may be most easily described for the circuit of FIG. 4, which is the preferred embodiment.

Figure 6:
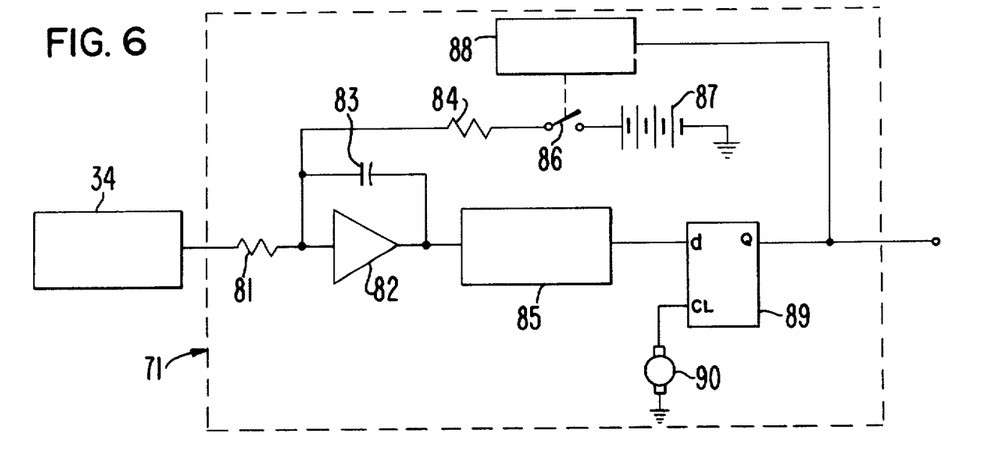
FIG. 6 shows in schematic form an electronic circuit for the voltage-to-frequency converter shown in FIG. 4.

A schematic diagram of one embodiment of the voltage-to-frequency converter 71 of FIG. 4, which comprises a modification that permits integration with respect to rotation angle instead of time, is shown in FIG. 6. The voltage-to-frequency converter 71 consists essentially of a resistor 81 in series with an integrated circuit amplifier 82 having a feedback capacitor 83 in parallel therewith, and having an additional feedback resistor 84 which can be switched into the circuit by switch 86. A threshold gate 85, connected to the output of amplifier 82, produces an output signal when the voltage across the capacitor 83 reaches a preset level, typically a few volts. A clock generator 90 in conjunction with a flip-flop 89 detects the output signal from the threshold gate 85, and thereby produces a signal at the output of the flip-flop 89. This flip-flop output signal actuates a switch driver 88 to close the switch 86, thereby connecting a battery 87 to the resistor 84. The polarity of the battery 87 is arranged so as to oppose the input signal from the detector 34. The capacitor 83 is thereby discharged below the preset level of the threshold gate 85. This removes the signal from the output of the threshold gate 85; and at the next clock pulse from the clock generator 90, the signal is removed from the output of the flip-flop 89. This, through the action of switch driver 88, causes the switch 86 to open, thereby stopping the discharge of the capacitor 83. The capacitor 83 is then free to charge again to the preset level of the threshold gate 85. This sequence of events is repeated as long as an input signal persists from the detector 34.

A more rigorous explanation of the operation of the voltage-to-frequency converter 71 of FIG. 6 can be made by noting that, if the detector 34 produces a voltage $e_{in}$ with respect to ground at any given instant of time, the current $i_{in}$ through the resistor 81 at that same instant of time is given by $i_{in} = e_{in}/R_{in}$, where $R_{in}$ is the resistance of the resistor 81. This current $i_{in}$ causes charge to accumulate on the capacitor 83, which in turn causes a voltage to occur at the output of the amplifier 82. In steady-state operation, the average current through the resistor 81 equals the average current through the resistor 84 because the circuit prevents the voltage on the capacitor 83 from exceeding a few volts. The current $i_f$ which flows through the resistor 84 when the switch 86 is closed is given by $i_f = e_{ref}/R_f$, where $e_{ref}$ is the voltage of the battery 87, and $R_f$ is the resistance of the resistor 84. Because of the action of the flip-flop 89, which can change state only upon receiving pulses from the clock generator 90, the switch 86 remains closed for exactly one period of the clock generator 90. Representing the period of the clock generator 90 by $T_{clock}$, the charge which flows into the resistor 84 for one closure of the switch 86 is given by $Q_f = i_f T_{clock} = (e_{ref}/R_f) T_{clock}$. This increment of charge, which represents the amount of charge which flows into the resistor 84 for one output pulse of the clock generator 90, is transferred at the output frequency of $f_o$ times per second. Therefore, the average current flowing through the resistor 84 is $$i_{f(average)} = Q_f f_o = (e_{ref}/R_f) T_{clock} f_o. \qquad (1)$$

Substituting $T_{clock} = 1/f_{clock}$, $$i_{f(average)} = (e_{ref}/R_f)(f_o/f_{clock}). \qquad (2)$$

This average current which flows through the resistor 84 must equal the input current to the resistor 81. Thus, $i_{f(average)} = i_{in}$, or $$e_{in}/R_{in} = (e_{ref}/R_f)(f_o/f_{clock}). \qquad (3)$$

Solving for $f_o$, $$f_o = (R_f/R_{in})(e_{in}/e_{ref}) f_{clock}. \qquad (4)$$

Thus, if the ratio of the resistance of the resistor 81 to the resistance of the resistor 84 remains constant and the clock generator 90 generates a constant frequency, and if the voltage of the battery 87 is constant, then the output frequency $f_o$ of the voltage-to-frequency converter 71 is strictly proportional to the input voltage $e_{in}$ from the detector 34. In practice, the required conditions of constancy are easily met, and the circuit shown in FIG. 6 is characterized by high stability.

Referring back to FIG. 4, the output signal from the voltage-to-frequency converter 71 is accumulated in a counter 73 for a period equal to the rotation period $T_{rot}$ of the crystal rod 24. The resulting number N in the counter 73 at the end of a rotation of the rod 24 is given by $$N = \int_O^{T_{rot}} f_o \, dt \qquad (5)$$

Substituting from equation (4) above, $$N = (R_f/R_{in})(f_{clock}/e_{ref}) \int_O^{T_{rot}} e_{in} \, dt \qquad (6)$$

Thus, the converter 71 in conjunction with the counter 73 acts to form the integral with respect to time of the signal $e_{in}$ from the detector 34. If the rotation frequency (and thus the rotation period) of the crystal rod 24 were to vary, then the integral in equation (6) above would vary, so that N would vary. It is the number N which ultimately determines the output control signal from the converter 71. In circumstances where the rotation frequency of the rod 24 is apt to vary, it becomes desirable to replace the constant frequency clock generator 90 of FIG. 6 with a mechanical transducer type of clock generator which produces M pulses per rotation of the crystal rod 24. The rotation period of the rod 24 then is related to the period of the mechanical transducer type of clock generator by the equation $T_{rot} = M \ T_{clock}$. Equation (6) above can be rewritten in terms of the angle of rotation $\theta$ of the crystal rod 24 as follows:

$$N = (R_f/R_{in})(1/e_{ref}) \int_O^{2\pi} e_{in} \, (T_{rot}/2\pi \ T_{clock}) \, d\theta \qquad (7)$$

where $\theta$, which is the angle through which the rod 24 has passed since the start of the count accumulation in the counter 73, is given by $\theta = (2\pi/T_{rot})t$. Since $T_{rot}/T_{clock} = M$, equation (7) above may be rewritten as:

$$N = (R_f/R_{in})(M/e_{ref})(\tfrac{1}{2}\pi) \int_O^{2\pi} e_{in} \, d\theta.$$

It can therefore be seen that the number N which is accumulated in the counter 73 is proportional to the integral of the output of the detector 34 with respect to the rotational angle of the crystal rod 24, and does not vary with the rotational speed of the rod 24, provided that the clock generator 90 consists of a mechanical transducer producing a constant number M of pulses during each rotation of the crystal rod 24.

It is the application of a synchronous integrator to the automatic diameter control system of a crystal growing apparatus which constitutes the present invention. Any circuit which effectively integrates a crystal rod diameter indicating signal over exactly one rotation of the crystal rod is comprehended within the scope of this invention. The invention is limited, therefore, only by the following claims.

What is claimed is:

1. An apparatus for controlling the growth of a crystal rod in the direction transverse to the axis of said rod as said rod is being drawn from a melt in a substantially vertical direction, said apparatus comprising:
   a. crucible means for containing said melt;
   b. means for providing relative rotation of said rod with respect to said melt;
   c. signal means for obtaining a signal responsive to a substantially circumferential dimension of said rod for successive rotations thereof and producing an electrical signal representative of said circumferential dimension obtained in a prior rotation, said signal means comprising a single sensor for sensing a substantially transverse dimension of said rod and developing a transverse signal and integration means for integrating said transverse signal whereby said circumferential representative signal is produced;
   d. means for comparing successive circumferential representative signals and generating a correction signal which is indicative only of change in said circumferential dimension; and
   e. means responsive to said correction signal for adjusting the rate at which said rod is drawn from said melt which effects the growth of said rod in said transverse direction.

2. The apparatus of claim 1 wherein said rod is affixed to a shaft, said shaft being rotatable about and translatable along the axis thereof, and said apparatus further comprising means for concurrently rotating said shaft and for translating said shaft away from said melt.

3. The apparatus of claim 1 wherein said signal comprises means for sensing the circumference of a meniscus which occurs at the interface between said rod and said melt.

4. The apparatus of claim 3 wherein said signal means comprises means for causing electromagnetic radiation to impinge upon said meniscus and means for detecting electromagnetic radiation reflected from said meniscus during rotation of said rod.

5. The apparatus of claim 4 comprising means to maintain the level of said melt at a constant vertical displacement in relation to the vertical coordinate of said detecting means whereby said meniscus is in constant relationship to said means for sensing the circumference of said meniscus.

6. The apparatus of claim 4 wherein said means for causing electromagnetic radiation to impinge upon said meniscus comprises a source of electromagnetic radiation, said source being disposed apart from a crucible containing the said melt.

7. The apparatus of claim 4 wherein said means for causing electromagnetic radiation to impinge upon said meniscus comprises a wall of a crucible in which said melt is contained.

8. The apparatus of claim 7 wherein said means for detecting electromaagneic radiation reflected from said meniscus comprises a pyrometer.

9. An apparatus for growing a crystal rod of constant transverse dimension by drawing said rod from a melt in a substantially vertical direction, said apparatus comprising:
  a. crucible means to contain said melt
  b. means for rotating said rod relative to said melt;
  c. means for sensing a substantially circumferential dimension of said rod for successive rotations thereof, comprising
    1. means for causing electromagnetic radiation to impinge upon a meniscus occurring at the interface of said rod and said melt,
    2. means including a single sensor for producing a single electrical signal responsive to electromagnetic radiation reflected from said meniscus, said electrical signal being continuous with respect to said rotations;
    3. means for performing an integration of said electrical signal over an integral number of rotations of said rod to produce an integral which is indicative of said circumferential dimension of said rod;
    4. means for retaining said integral while a subsequent integration is being performed;
  d. means for comparing said retained integral with a subsequently obtained integral and generating a correction signal responsive to the difference therebetween;
  e. adjustment means responsive to said correction signal for adjusting the rate at which said rod is drawn from said melt which affects the growth of said rod in said transverse dimension so as to maintain a constant transverse dimension for said rod.

10. The apparatus of claim 9 wherein said means for causing electromagnetic radiation to impinge upon said meniscus comprises a wall of a crucible in which said melt is contained.

11. The apparatus of claim 9 wherein said means for producing an electrical signal responsive to said reflected radiation comprises a pyrometer.

12. The apparatus of claim 9 wherein said means for causing electromagnetic radiation to impinge upon said meniscus comprises a source of electromagnetic radiation, said source being disposed apart from a crucible containing said melt.

13. The apparatus of claim 9 wherein said means for performing an integration comprises a voltage to frequency converter and an electronic counter.

14. The apparatus of claim 9 comprising means to maintain the level of said melt at a constant vertical displacement in relation to the vertical coordinate of said means for producing an electrical signal responsive to the radiation reflected from said meniscus.

* * * * *